United States Patent
Narhi

(10) Patent No.: US 8,149,074 B2
(45) Date of Patent: Apr. 3, 2012

(54) TUNING ELEMENT AND TUNABLE RESONATOR

(75) Inventor: Harri Narhi, Kempele (FI)

(73) Assignee: Powerwave Comtek Oy, Kempele (FI)

( * ) Notice: Subject to any disclaimer, the term of this patent is extended or adjusted under 35 U.S.C. 154(b) by 311 days.

(21) Appl. No.: 12/296,636

(22) PCT Filed: Apr. 17, 2007

(86) PCT No.: PCT/FI2007/050198
§ 371 (c)(1),
(2), (4) Date: Sep. 17, 2009

(87) PCT Pub. No.: WO2007/125161
PCT Pub. Date: Nov. 8, 2007

(65) Prior Publication Data
US 2010/0007442 A1   Jan. 14, 2010

(30) Foreign Application Priority Data
Apr. 27, 2006  (FI) ...................... 20065272

(51) Int. Cl.
H01L 41/083 (2006.01)
H01P 7/04 (2006.01)
(52) U.S. Cl. .................... 333/235; 333/207; 333/223
(58) Field of Classification Search .......... 333/202, 333/206, 207, 223, 235, 224
See application file for complete search history.

(56) References Cited

U.S. PATENT DOCUMENTS

| | | | |
|---|---|---|---|
| 2,463,472 A | 3/1949 | Bach | |
| 3,471,811 A | 10/1969 | Klotz | |
| 4,028,646 A * | 6/1977 | Ikushima et al. | 333/193 |
| 4,435,680 A | 3/1984 | Froncisz et al. | |
| 4,692,727 A * | 9/1987 | Wakino et al. | 333/219.1 |
| 5,208,506 A | 5/1993 | Yamashita et al. | |
| 5,406,233 A * | 4/1995 | Shih et al. | 333/161 |
| 6,262,639 B1 * | 7/2001 | Shu et al. | 333/202 |
| 6,593,832 B2 * | 7/2003 | Raty | 333/222 |
| 6,801,104 B2 * | 10/2004 | Zhu et al. | 333/202 |
| 7,180,391 B2 * | 2/2007 | Ala-Kojola | 333/207 |
| 7,586,393 B2 * | 9/2009 | Tilmans et al. | 333/232 |
| 7,728,701 B2 * | 6/2010 | Lin et al. | 333/209 |
| 2002/0089263 A1 | 7/2002 | Morita et al. | |
| 2004/0061573 A1 | 4/2004 | Harris | |
| 2004/0145533 A1 | 7/2004 | Taubman | |
| 2008/0211601 A1 * | 9/2008 | Bates | 333/186 |

FOREIGN PATENT DOCUMENTS

| | | |
|---|---|---|
| DE | 102005012375 | 12/2005 |
| GB | 2012479 | 7/1979 |
| WO | WO-03055063 | 7/2003 |
| WO | WO-2004040268 | 5/2004 |

* cited by examiner

Primary Examiner — Seungsook Ham
(74) Attorney, Agent, or Firm — OC Patent Law Group

(57) ABSTRACT

A resonator is provided with a tuning element based on piezoelectricity. The piezoelectric basic element includes at least one piezoelectric layer and a metal layer. Such a basic element is first coated with a thin insulating layer and then with a good conductor. The thickness of the conductive coating is greater than the skin depth of a field corresponding to the operating frequency of the structure in the conductor. The tuning element formed in this manner is fastened on, e.g., some inner surface of the resonator cavity and acts to change the natural frequency of the resonator by electric control. When using the tuning element, no mechanical arrangement is required for moving the tuning element. Furthermore, the tuning element does not cause considerable dielectric losses nor intermodulation when being in a radiofrequency electromagnetic field, because the field cannot significantly penetrate through said conductive coating into the piezoelectric material.

13 Claims, 4 Drawing Sheets

TUNING ELEMENT AND TUNABLE RESONATOR

CROSS REFERENCE TO PRIOR APPLICATION

Figure 1:
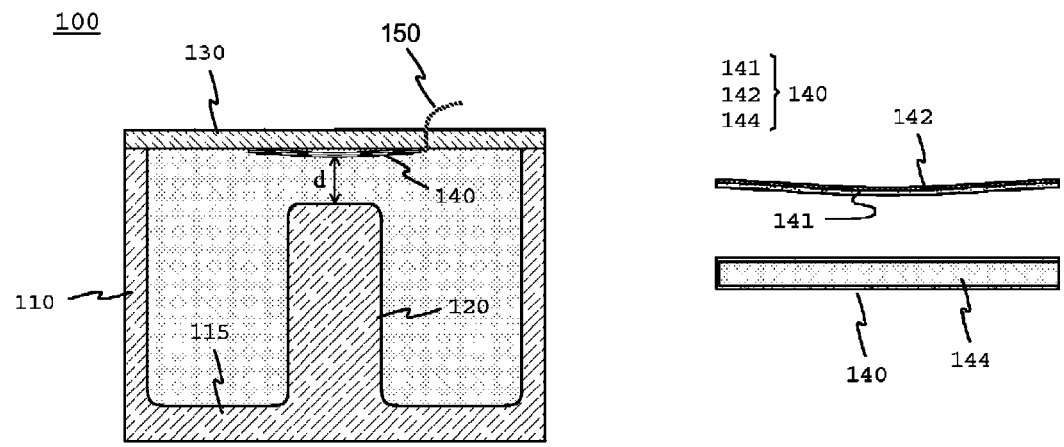

This is a U.S. National Phase application under 35 U.S.C. §371 of International Patent Application No. PCT/FI2007/050198, filed Apr. 17, 2007, and claims the benefit of Finnish Patent Application No. 20065272, filed Apr. 27, 2006 both of which are incorporated by reference herein. The International Application published in English on Nov. 8, 2007 as WO 2007/125161 under PCT Article 21(2).

The invention relates to a tuning element based on piezoelectricity and a resonator which has such a tuning element for changing the natural frequency of the resonator by electric control.

Piezoelectricity means the feature of several crystal-structured materials in which mechanical force applied to the material causes an electric potential difference in it and, inversely, an electric field applied to the material causes a mechanical transformation in it. Depending on the cutting direction of the crystal and the direction of the electric field, the transformation can take place e.g. as a change of the thickness and the length of a plate-like piece. If a piezoelectric plate is strip-like and fastened to a rigid base at its both ends, an increase in length causes the strip to bend so that its middle part becomes upraised from the base. Correspondingly, if a piezoelectric plate e.g. of circular shape is fastened to a rigid base at its edges, extension in the plane of the plate causes its middle area to rise from the base. A piezoelectric strip can also be fastened for its whole length to another flexible strip which does not react mechanically to the electric field. If such a combined element has been fastened only at one end, then the change in the length of the piezoelectric part forces the free end of the element to turn to the direction corresponding the change of the length.

A "tuning element" means in this specification a component by means of which the natural frequency of a circuit or a device can be adjusted. Such tunable devices are e.g. resonators used in the filters of radio apparatuses. Of radiofrequency resonators, different cavity and coaxial resonators are common because, by using them, low-loss filters enduring relatively high powers can be constructed. The basic structure of the coaxial resonator comprises an inner conductor, an outer conductor consisting of side walls, a bottom and a lid. The bottom and the lid are in a galvanic connection to the outer conductor, and all three together form a closed resonator housing. Usually, the lower end of the inner conductor joins galvanically the bottom and the upper end is "in the air", in which case the transmission line forming the resonator is short-circuited at its lower end and open at its upper end. Then, it is the case of a quarter-wave resonator, because the wavelength corresponding its natural frequency, or basic resonance frequency, is four times the electric length of the transmission line.

The tuning of the coaxial quarter-wave resonator is usually based on changing the capacitance between the inner conductor and the lid, in which case also the electric length and the natural frequency of the resonator are changed. Traditionally, metal tuning screws put through the lid of the resonator have been used in changing the capacitance. When the screw is driven, its distance from the inner conductor of the resonator changes, as a consequence of which the capacitance between the inner conductor and the lid changes. A disadvantage of using tuning screws is that screw accessories increase the number of filter components and the threaded screw holes mean an increase in the number of work steps and thus an increase in manufacturing costs. Furthermore, the electrical contact in threads can deteriorate in the course of time, which causes changes in tuning and increased losses in the resonator. There is also a risk of electric breakdown in high-power filters if the point of the screw is close to the end of the inner conductor. Furthermore, in a multi-resonator filter it can be necessary to manually drive the screws in several stages to obtain the desired frequency response. Thus, the tuning is time-consuming and relatively expensive.

The capacitance between the inner conductor and the surrounding conducting parts of a coaxial resonator can also be changed by means of bendable tuning elements. At the end of the inner conductor there can be a planar extension part parallel with the lid and at its edge at least one projection parallel with a side wall. By bending the projection, said capacitance and, at the same time, the natural frequency of the resonator changes. A disadvantage also of this kind of solution is that in a multi-resonator filter it can be necessary to manually bend the tuning elements in several stages to obtain the desired frequency response. In addition, the lid of the filter must be opened and closed for each tuning stage, the tuning then being time-consuming and expensive.

As known, the tuning element of a resonator can also be dielectric. In this case, the fact that the strength of the electric field in the resonator cavity varies depending on location is utilised. When a dielectric piece is moved e.g. to the direction of stronger electric field, the effective dielectric coefficient of the part in question of the resonator cavity increases. Then, in the case of a quarter-wave resonator, the capacitance between the upper end of the inner conductor and conductor surfaces around it increases, the electric length of the resonator increases and the natural frequency decreases. A disadvantage of the dielectric tuning element is that it requires a moving mechanism which, in its turn, means increasing production costs. In addition, its material causes dielectric losses and thus attenuation in the signal.

The tuning element of a resonator can also be piezoelectric. FIG. 1 shows an example of such a case. There is a quarter-wave resonator in the figure, the basic structure of which comprises an outer conductor 110, an inner conductor 120, a bottom 115 and a lid 130. Additionally, the structure includes a piezoelectric tuning element 140 for the tuning of the resonator, which member is seen separately as a side view and from below in the accompanying figures next to the resonator. The tuning element 140 is a strip-like object which has two actual layers: the lower layer 141 is of piezoelectric material and the upper layer 142 is of some metal. The tuning element is fastened from its both ends on the inner surface of the resonator lid above the upper end of the inner conductor so that the ends of the metal layer of the member are in a galvanic contact to the lid 130. The control voltage of the tuning element is led via a small hole in the lid by a line 150. One conductor of this line is connected to the metal layer 142 and the other to a conductive coating 144 at least partly covering the lower surface of the piezoelectric layer. This kind of coating is required for leading the electric field evenly to the whole piezoelectric layer.

The tuning element 140 can be shaped so that, in the inactive state, it has been bent from the middle somewhat towards the inner conductor 120. The distance d between the inner conductor and the metal layer of the tuning element is thus smaller than the distance between the inner conductor and the lid 130. Depending on the polarity of control voltage, the distance d either increases or decreases as the length of the piezoelectric strip changes. In the former case, the capacitance between the inner conductor and the lid decreases, for which reason the natural frequency of the resonator increases.

In the latter case, the natural frequency decreases correspondingly. The extent of the change naturally depends on the magnitude of the absolute value of the control voltage.

The tuning element can also be fastened in a corresponding way on the upper surface of the inner conductor. Further, it can be fastened to the resonator lid only at its one end so that its free end is above the inner conductor. In principal, the possibility of the resonator tuning is also in these cases similar to the one described above.

Figure 2:
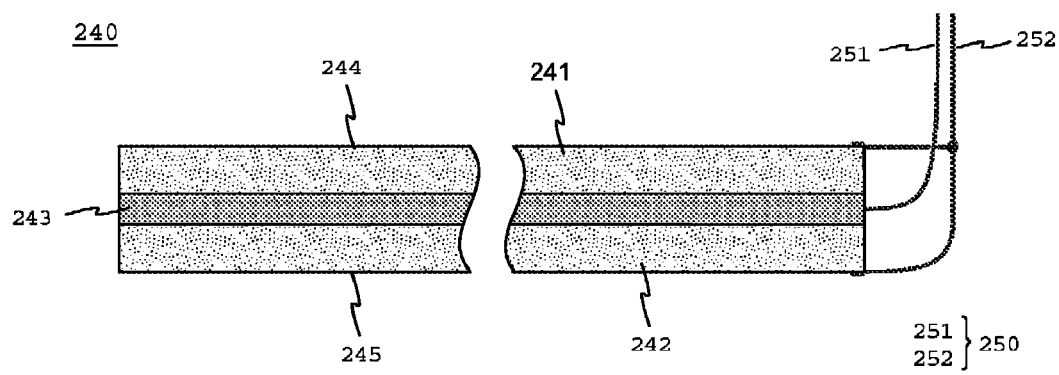

FIG. 2 shows a second example of a known piezoelectric tuning element. The tuning element 240 is presented enlarged as a side view and the largest part from the middle cut away. It has three actual layers: there is the first piezoelectric layer 241 uppermost in the figure, a metal layer 243 in the middle and the second piezoelectric layer 242 undermost. In addition, a first conductive coating 244 is on the upper surface of the first piezoelectric layer and a second conductive coating 245 on the lower surface of the second piezoelectric layer for leading the electric field evenly to the piezoelectric layers. By the multi-layer structure thermal stability is achieved better than e.g. by the tuning element according to FIG. 1. Namely, the tuning element 240 being bent e.g. from the middle downwards, the thermal expansion of the first piezoelectric layer 241 tends to straighten the member, but the thermal expansion of the second piezoelectric layer 242 tends to bend it further. For this reason, the arched form of the element remains almost unchanged.

The electric field is led to the tuning element with a line 250 which has a first 251 and a second conductor 252. The first conductor 251 is connected to the metal layer 243, and the second conductor 252 is connected both to the first conductive coating 244 and the second conductive coating 245. Because of this, the directions of the electric field in piezoelectric layers are opposite, from which further follows that when the length of one layer decreases, the length of the other layer increases. The changes in the length of both layers thus bend the element to the same direction, as they should. When the polarity of the control voltage changes, also the bending direction of the tuning element changes.

The number of layers in the piezoelectric tuning element can be greater than three in order to make the element as ideal as possible.

When using the type of piezoelectric tuning elements described above, its mechanical control is avoided because the transformation takes place by an electric control. A disadvantage is, however, dielectric losses when the high-frequency electromagnetic field propagates inside the tuning element at least via its side surfaces. The imaginary part of the complex permittivity of piezoelectric materials is large in relation to the real part, i.e., the loss angle δ and its tangent are relatively large. For this reason said dielectric losses are considerably high. In addition, piezoelectric material is non-linear of its electric characteristics, which results in intermodulation to the signal propagating via the resonator.

The object of the invention is to minimize aforementioned disadvantages related to prior art. The tuning element according to the invention is characterised by what is presented in the independent claim 1. The resonator according to the invention is characterised by what is presented in the independent claim 6. Some advantageous embodiments of the invention are described in the other claims.

The basic idea of the invention is the following: To the piezoelectric basic element belong at least one piezoelectric layer and metal layer. Such a basic element is first covered with a thin insulating layer and then with a good conductor. The thickness of the conductive coating is greater than the skin depth of the field corresponding the operating frequency of the structure in the conductor. The tuning element thus formed is fastened on e.g. some inner surface of the resonator cavity to change the natural frequency of the resonator by an electric control.

An advantage of the invention is that when using a tuning element according to it, a mechanical arrangement for moving the tuning element is not needed, which decreases the manufacturing costs of the whole product and increases its reliability. A further advantage of the invention is that the tuning element does not cause considerable dielectric losses when being in a radiofrequency electromagnetic field. This is caused by the fact that the field cannot penetrate in a considerable amount through said conductive coating into the piezoelectric material. From this follows such an additional advantage that the piezoelectric material does not either cause intermodulation to the signal in the field of which the tuning element is.

The invention will now be described in detail. The description refers to the accompanying drawings in which FIG. 1 shows an example of a tuning element according to prior art in a resonator, FIG. 2 shows a second example of a tuning element according to prior art, FIGS. 3a,b show an example of a tuning element according to the invention, FIG. 4 shows an example of a coaxial resonator according to the invention, FIGS. 5a,b show a second example of a coaxial resonator according to the invention, FIG. 6 shows a third example of a coaxial resonator according to the invention, FIGS. 7a,b show an example of a tuning element and a resonator according to the invention, and FIG. 8 shows another example of a resonator according to the invention.

FIGS. 1 and 2 were already described in connection with the description of prior art.

Figure 3A:
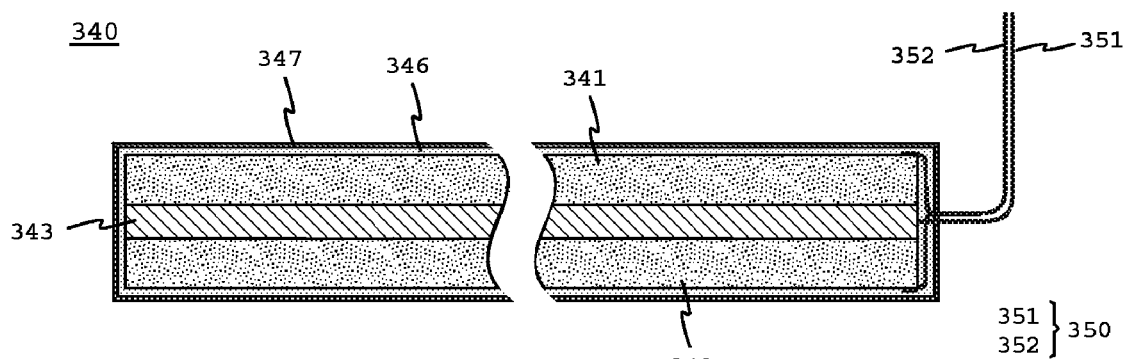
Figure 3B:
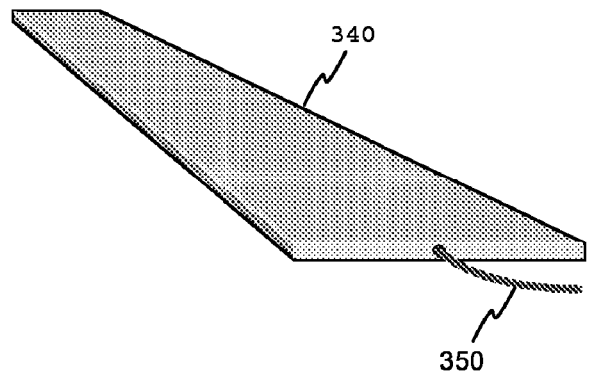
Figure 4:
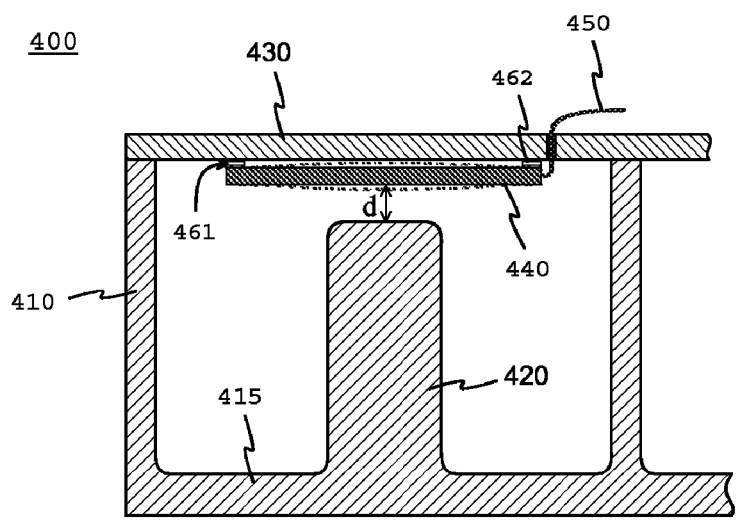

FIGS. 3a and 3b show an example of a tuning element according to the invention. FIG. 3a is a side view of the tuning element 340 as a longitudinal section and the largest part from the middle cut away, and FIG. 3b shows it as a perspective drawing. The tuning element 340 comprises a basic element similar to the one shown in FIG. 2 and its coating layers according to the invention. Thus, the basic element has a metal layer 343 in the middle and a first 341 and a second 342 piezoelectric layer with their immediate conductive coatings. There are two coating layers: the basic element has first an insulating coating 346 and this further has a conductive coating 347. As its name suggests, the function of the insulating coating is to insulate the conductive coating galvanically from the basic element. The insulating coating is relatively thin and of flexible material so that it does not resists the bending of the tuning element much. The function of the conductive coating is, according to the invention, to prevent the penetration of the electromagnetic field into the piezoelectric material. For this reason, the thickness of the conductive coating is greater than the skin depth of the field corresponding the operating frequency of the structure in the conductor. If the thickness of the conductive coating is e.g. three times greater than the skin depth, the field strength inside the "housing" formed by the conductive coating is only about 5% of the field strength outside it. When using copper, the skin depth at the gigahertz frequency is 2.7 μm, so about 10 μm is an adequate thickness for the conductive coating.

When the access of the electromagnetic field to the piezoelectric material is prevented, the dielectric losses of the tuning element remain low, and the piezoelectric material does not cause intermodulation to the signal in the field of which the tuning element is.

The tuning element 340 is a strip-like plate: it is relatively thin and elongated rectangle seen from above. The control line 350 of the tuning element joins the element at its one end and is connected in the same way as in FIG. 2: the first conductor 351 is connected to the metal layer 343, and the second conductor 352 is connected to the immediate conductive coating of both the first and the second piezoelectric layer.

FIG. 4 shows an example of a coaxial resonator which comprises a tuning element according to the invention. The resonator 400 shown as a longitudinal section is a similar quarter-wave resonator of its basic structure as the one in FIG. 1. Thus, it comprises a resonator housing formed by an outer conductor 410, a bottom 415 and a lid 430 and an inner conductor 420 the lower end of which joins galvanically the bottom and the upper end is in the free space in the resonator cavity. The tuning element 440 is similar to the one in FIGS. 3a and 3b, a piezoelectric strip isolated electromagnetically with the conductive coating. In this example, it is located in the upper part of the resonator cavity above the level of the upper surface of the inner conductor, i.e., in the space in which the electric field is the most strongest when the structure resonates. The tuning element is fastened at its ends to the lid 430 via projections 461, 462 on the lower surface of the lid. The projections separate the tuning element from the lid enough for it to be able to bend from the middle also towards the lid. The projections can be of the same object with the lid or conductive intermediate pieces fastened to it. The fastening of the tuning element to the projections 461, 462 takes place e.g. by soldering or by screws penetrating the tuning element.

The end of the control line 450 of the tuning element 440 is brought to the resonator cavity via a small hole in the lid 430. The tuning element can be controlled so that it bends either upwards or downwards, as described in the description of FIG. 2. The amplitude of the movement, i.e., the maximum change of the distance d between the upper surface of the inner conductor and the tuning element is e.g. ±0.25 mm. By this kind of movement such a capacitance change is obtained that the natural frequency of a resonator designed for the range of 1.8-1.9 GHz changes e.g. ±60 MHz.

Figure 5A:
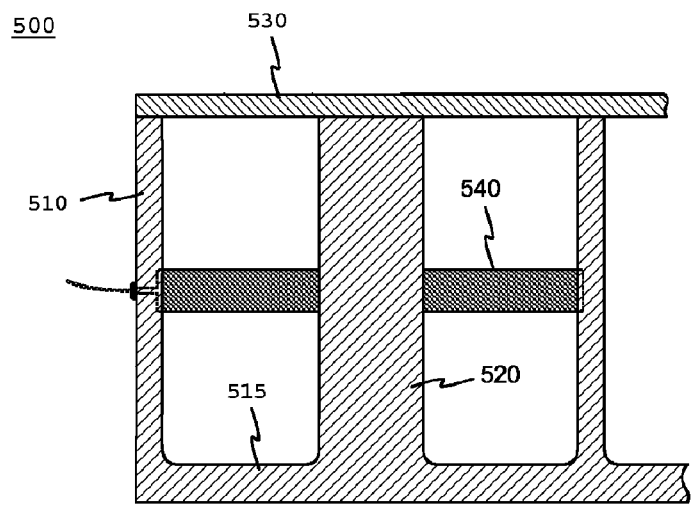
Figure 5B:
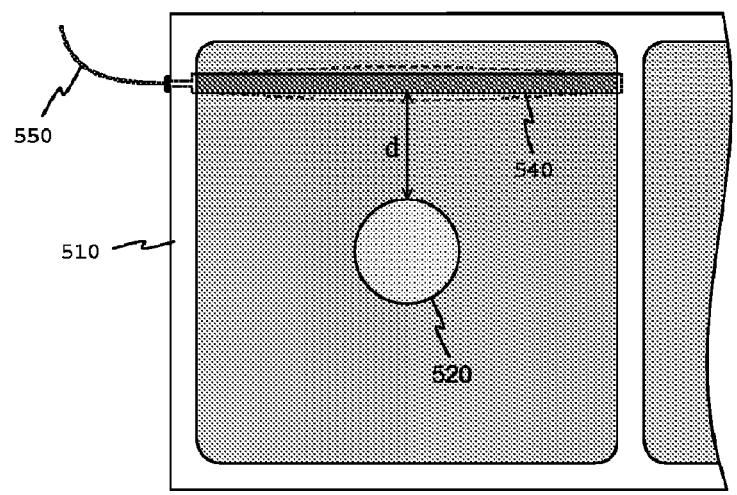
Figure 6:
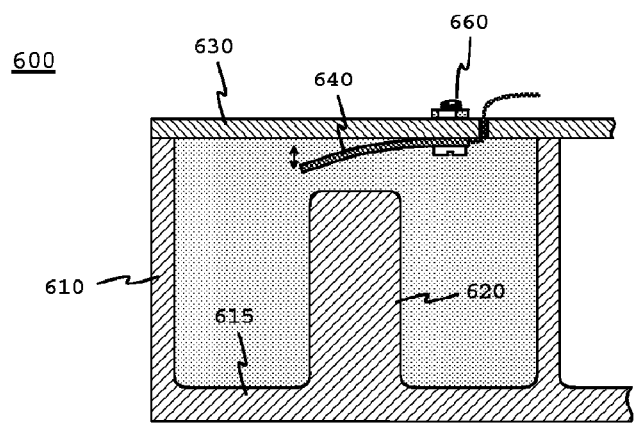

FIGS. 5a and 5b show a second example of a coaxial resonator which has a tuning element according to the invention. FIG. 5a is a side view of the resonator 500 as a longitudinal section and FIG. 5b is a top view of it the lid removed. In this example, the resonator is a half-wave resonator, which appears from the fact that the inner conductor 520 of the resonator extends from the bottom 515 to the lid 530. The transmission line formed by the inner conductor and the outer conductor 510 is thus short-circuited from its both ends. The outer conductor consists of four side walls having a rectangular cross section. When the half-wave resonator oscillates at its natural frequency, the magnetic field is at its strongest at the ends of the transmission line and the electric field is at its strongest in the middle of the transmission line. For this reason, the tuning element 540 is in this example placed around halfway of the resonator in elevation so that its longitudinal direction is horizontal and its lateral direction is vertical. The tuning element fastens to the structure so that its ends extend to recesses in the two opposite side walls. Naturally, it would be also possible to fasten the tuning element to projections arranged to the closest side wall of the resonator in a corresponding way as in FIG. 4 or diagonally to two adjacent side walls.

The control line 550 of the tuning element extends to the tuning element via a small hole in the resonator side wall at one of said recesses. When the tuning element is controlled, it bends either towards the inner conductor 520 or away from it depending on the polarity of control voltage. In the former case the natural frequency of the resonator increases and in the latter case it decreases.

FIG. 6 shows a third example of the use of a tuning element according to the invention in a coaxial resonator. The resonator 600 shown as a longitudinal section is a similar quarter-wave resonator of its basic structure as the one in FIGS. 1 and 4. The tuning element 640 is located in the upper part of the resonator cavity above the level of the upper surface of the inner conductor 620, as in FIG. 4. The difference compared to FIG. 4 is that the tuning element 640 is fastened only at its one end to the lid 630. Here, the fastening is implemented by a bolt 660. Seen from above, the fastening point is off from the inner conductor 620, and the free end of the tuning element extends above the inner conductor. The tuning element is manufactured so that in its inactive state it is somewhat arched towards the inner conductor. Then, when controlling the tuning element, its free end turns either towards the upper end of the inner conductor or away from it depending on the polarity of the control voltage. Naturally, the tuning element can be in inactive state also straight and fastened via a conductive projection to the lid.

Figure 7A:
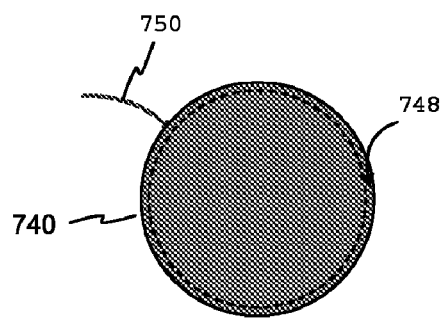
Figure 7B:
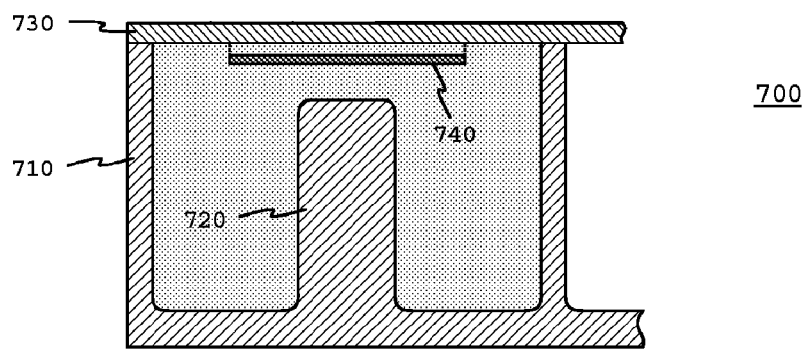
Figure 8:
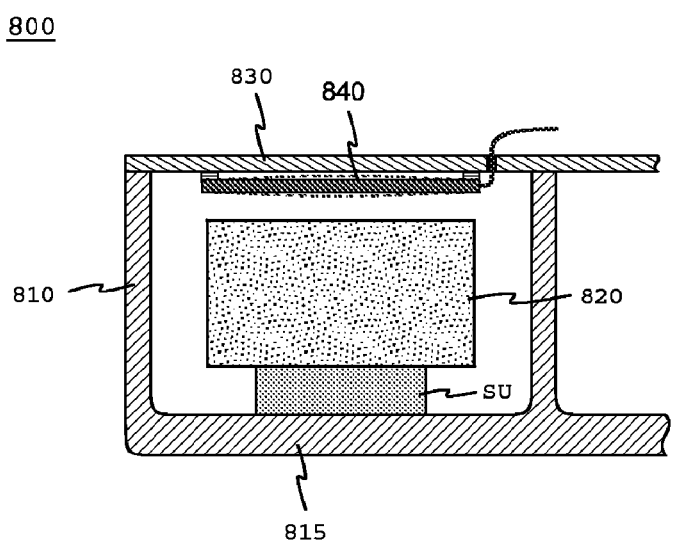

FIGS. 7a and 7b show an example of a tuning element and a resonator according to the invention. FIG. 7a is a top view of the tuning element 740 only. It is a piezoelectric plate of circular form, which plate is completely coated with conductive material according to the invention. The control voltage is led to the tuning element with a line 750. The tuning element 740 is fastened from its edges so that its side surface shaped like a cylindrical ring cannot move in any direction in the level of the tuning element. The dashed line in FIG. 7a delimits a relatively narrow edge area 748 of the upper surface of the tuning element which area presents an example of a fastening area. FIG. 7b is a longitudinal section of the resonator 700 provided with the tuning element 740. This is a similar quarter-wave resonator of its basic structure as the one in FIGS. 1, 4 and 6. The tuning element 740 is located in the upper part of the resonator cavity above the level of the upper surface of the inner conductor 720, as in FIG. 4. The tuning element 740 is thus fastened at its ends to the lid 730. The fastening can be made e.g. so that the edge area 748 of the upper surface visible in FIG. 7a is soldered to a ring-shaped projection formed on the lower surface of the lid. The inner diameter of the projection of the lid can also be the same as the diameter of the tuning element, in which case the tuning element can be fastened at its side surface. Naturally, the projection of the lid can also extend to the side of the lower surface of the tuning element. When controlling the tuning element, it bends to a dent either towards the upper end of the inner conductor or away from it depending on the polarity of the control voltage.

FIG. 8 shows a further example of a resonator according to the invention. The resonator 800 is presented as a longitudinal section. It has a resonator cavity confined by an outer conductor 810, a bottom 815 and a lid 830. In the cavity there is a solid, cylindrical dielectric object 820 for decreasing the size of the resonator. The ends of the cylinder are parallel to the bottom and the lid of the resonator, and it has been raised above the bottom 815 of the resonator by a dielectric support piece SU. The support piece has substantially lower permittivity than the dielectric object 820. This has been dimensioned so that a wave form $TE_{01}$ is excited in it at the operating frequencies of the filter. Thus, the type of the resonator is a half-wave cavity resonator.

The tuning element 840 is a piezoelectric member for example similar to the one in FIGS. 3a and 3b or FIG. 7a. It is located in the upper part of the resonator cavity above the upper surface of the dielectric object 820 and, is also in this case, fastened to the lid so that its conductive coating is in a galvanic contact to the lid. When the tuning element 840 is controlled so that it bends towards the dielectric object 820, the electric size of the object increases, in which case the natural frequency of both the dielectric object and the whole resonator decreases. Correspondingly, when the tuning element is controlled so that it bends towards the lid 830, the natural frequency of the resonator increases. In the example of FIG. 8, the tuning element is strip-like and fastened at its both ends. Naturally, a strip-like element can also be fastened only at its one end as in FIG. 6.

In FIGS. 4-8, the structure is drawn to continue to the right of the described resonator. This means that the resonator in question can be a part of a multi-resonator filter. In that case, each resonator of the filter has a tuning element according to the invention. These can be controlled separately or together.

In this description and claims, the epithets "lower", "upper", "horizontal", "vertical", "a side view" and "from above" refer to the position of the resonator in which its outer conductor is vertical and its bottom the undermost. The operating position of the resonator can naturally be whichever.

Above, a piezoelectric tuning element and resonator structures provided with such an element have been described. The structure can naturally differ in its details from the ones described. The inventive idea can be applied in different ways within the limitations set by the independent claim 1.

The invention claimed is:

1. A tuning element with a basic element comprising at least one piezoelectric layer and at least one metal layer, to which basic element control conductors are connected to lead an electric field into said at least one piezoelectric layer for thus bending the tuning element in an application, wherein said basic element has an insulating coating which further has a conductive coating to prevent the penetration of an electromagnetic field into said at least one piezoelectric layer and said insulating coating is for insulating said conductive coating galvanically from the basic element.

2. A tuning element according to claim 1, wherein the thickness of said conductive coating is at least three times the skin depth of a field corresponding to the operating frequency of the tuning element in said conductive coating.

3. A tuning element according to claim 1, wherein said basic element comprises one metal layer and two piezoelectric layers, which metal layer is between the piezoelectric layers, to improve the thermal stability of the tuning element.

4. A tuning element according to claim 1, wherein said tuning element is a strip-like plate having the form of an elongated rectangle as seen in the direction of the normal to the plate plane.

5. A tuning element according to claim 1, wherein said tuning element is a planar plate, substantially of circular shape as seen in the direction of the normal to the plate plane.

6. A resonator which comprises a tuning elemental according to claim 1.

7. A resonator according to claim 6, which comprises a resonator housing formed by an outer conductor, a bottom, a lid and an inner conductor, a lower end of said inner conductor joins galvanically the bottom and an upper end of said inner conductor is in free space in a resonator cavity, in which case a certain capacitance prevails between the upper end of the inner conductor and an upper part of the resonator housing, wherein the tuning element is located in an upper part of the resonator cavity above the level of an upper surface of the inner conductor fastened to the lid of the resonator.

8. A resonator according to claim 7, wherein the tuning element is strip-like and fastened at its both ends to the lid via conducting projections on lower surface of the lid so that the tuning element has space to bend from the middle towards both the inner conductor.

9. A resonator according to claim 7, wherein the tuning element is strip-like and fastened only at its one end to the lid so that a free end of the tuning element has space to bend towards both the inner conductor and the lid.

10. A resonator according to claim 7, where the tuning element is planar, substantially of circular shape as seen in the direction of its normal and fastened at its edges to the lid via a conducting ring-like projection on the lower surface of the lid, so that the middle area of the tuning element has space to bend towards both the inner conductor and the lid.

11. A resonator according to claim 6, which comprises a resonator housing formed by an outer conductor, a bottom and a lid; and in a resonator cavity confined by the housing there is an inner conductor, the lower end of which joins galvanically the bottom and the upper end of which joins galvanically the lid, wherein said tuning element is strip-like and is located in the middle part of the resonator cavity so that its longitudinal direction is substantially horizontal and its lateral direction is vertical, and said tuning element is fastened to at least one side wall of the outer conductor so that the tuning element has space to bend from the middle towards both the inner conductor and the closest side wall.

12. A resonator according to claim 6, which comprises a resonator housing formed by an outer conductor, a bottom and a lid; in a resonator cavity confined by the housing there is located a solid dielectric object supported by the bottom to decrease the size of the resonator, which dielectric object is dimensioned so that the resonator is a half-wave cavity resonator, wherein a tuning element is located in an upper part of the resonator cavity above the level of an upper surface of the dielectric object and is fastened to the lid of the resonator so that the tuning element has space to bend towards both the dielectric object and the lid.

13. A resonator filter comprising resonators, each of said resonators comprises a tuning element according to claim 1.

* * * * *